United States Patent
Kim

(10) Patent No.: US 9,568,890 B1
(45) Date of Patent: Feb. 14, 2017

(54) ALL-DIGITAL DELAY-LOCKED LOOP CIRCUIT BASED ON TIME-TO-DIGITAL CONVERTER AND CONTROL METHOD THEREOF

(71) Applicant: Hongik University Industry-Academia Cooperation, Seoul (KR)

(72) Inventor: Jong Sun Kim, Seongnam-si (KR)

(73) Assignee: HONGIK UNIVERSITY INDUSTRY-ACADEMIA COOPERATION, Seoul (KR)

( * ) Notice: Subject to any disclaimer, the term of this patent is extended or adjusted under 35 U.S.C. 154(b) by 0 days.

(21) Appl. No.: 15/226,323

(22) Filed: Aug. 2, 2016

(30) Foreign Application Priority Data

Nov. 6, 2015 (KR) ........................ 10-2015-0155741

(51) Int. Cl.
 H03M 1/50 (2006.01)
 G04F 10/00 (2006.01)
 H03L 7/089 (2006.01)
 H03K 5/156 (2006.01)
 H03L 7/18 (2006.01)
 H03L 7/081 (2006.01)
 H03M 1/56 (2006.01)

(52) U.S. Cl.
 CPC ........... G04F 10/005 (2013.01); *H03K 5/1565* (2013.01); *H03L 7/0814* (2013.01); *H03L 7/0891* (2013.01); *H03L 7/0895* (2013.01); *H03L 7/18* (2013.01); *H03M 1/56* (2013.01); *H03M 2201/4233* (2013.01)

(58) Field of Classification Search
 CPC ... H03M 2201/4233; H03M 1/56; H03L 7/18; H03L 7/0891; H03L 7/0895; H03L 7/0814; H03K 5/1565

USPC ........ 341/166, 169; 327/148, 156, 157, 158, 327/175
See application file for complete search history.

(56) References Cited

U.S. PATENT DOCUMENTS 8,294,498 B2  10/2012 Wang et al.
8,866,522 B1 * 10/2014 Kim ..................... H03L 7/0814
327/148

FOREIGN PATENT DOCUMENTS

KR   10-1326117 B1   11/2013

OTHER PUBLICATIONS

Jul. 29, 2016, Korean Office Action for related KR application No. 10-2015-0155741.

\* cited by examiner

*Primary Examiner* — Joseph Lauture
(74) *Attorney, Agent, or Firm* — Paratus Law Group, PLLC

(57) ABSTRACT

Disclosed is an all-digital delay locked loop circuit based on a time-to-digital converter and a control method thereof. The all-digital delay locked loop circuit includes a phase inversion locking control circuit for determining whether or not to use a phase inversion locking algorithm by detecting a phase difference between an input clock and an output clock and outputting the input clock or an inverted input clock; and a phase synchronization unit connected to an output terminal of the phase inversion locking control circuit to receive an output signal of the phase inversion locking control circuit and a control signal and perform phase synchronization, in which the phase synchronization unit includes a digital control delay line for receiving the input clock or the inverted input clock output from the phase inversion locking control circuit and reducing a phase error between the input clock and the output clock.

17 Claims, 10 Drawing Sheets

ALL-DIGITAL DELAY-LOCKED LOOP CIRCUIT BASED ON TIME-TO-DIGITAL CONVERTER AND CONTROL METHOD THEREOF

CROSS-REFERENCE TO RELATED APPLICATION

This application claims priority to Korean Patent Application No. 10-2015-0155741 (filed on Nov. 6, 2015), which is hereby incorporated by reference in its entirety.

BACKGROUND

The present invention relates to an all-digital delay locked loop circuit based on a time-to-digital converter, which combines the time-to-digital converter with a phase inversion locking algorithm, and a control method thereof, and more specifically, to an all-digital delay locked loop circuit based on a time-to-digital converter and a control method thereof, which can implement a short locking time, low power consumption, a small chip area and an improved jitter performance, while operating at a very high maximum operating frequency, by combining a phase inversion locking algorithm, operating in a wide operating frequency range by reducing the number of delay elements in a digital control delay line by half in maximum, with a hybrid algorithm including a time-to-digital converter.

A delay locked loop (DLL) is used to improve data transmission speed in an I/O interface between chips in a high-speed integrated circuit such as DRAM, and it is also used for clock data recovery (CDR).

A delay locked loop circuit is generally classified in a method of analogically or digitally adjusting delay of a delay circuit and is divided into two types of an analog delay locked loop circuit and a digital delay locked loop circuit according to such a feedback loop type.

A phase inversion locking algorithm is an algorithm for determining whether or not to use a phase inversion algorithm for a clock input into a delay unit and outputting the input clock or an inverted input clock when such a delay locked loop circuit operates.

If the phase inversion locking algorithm is used, the number of delay units of a delay locked loop can be reduced by half in maximum, and thus the operating frequency range can be extended, the locking time can be reduced greatly compared with an existing method, and low power consumption and a small chip area can be implemented.

A conventional technique has a problem of high power and a long locking time. In addition, a maximum operating frequency is limited due to intrinsic delay of a delay line when the digital delay locked loop operates. A conventional delay locked loop (DLL) using a time-to-digital converter having an advantage of a fast locking time has a problem of a large chip area and high power consumption.

Accordingly, required is development of a delay locked loop circuit having a wide operating frequency range while further increasing the maximum operating frequency and, at the same time, capable of reducing a locking time while implementing fundamental factors such as a high delay resolution, low power consumption, a small chip area and a high jitter performance.

SUMMARY

Therefore, the present invention has been made in view of the above problems, and it is an object of the present invention to provide an all-digital delay locked loop circuit based on a time-to-digital converter of a hybrid type and a control method thereof, in which the time-to-digital converter controlled by a timing controller is applied to have a short locking time, low power consumption, a small chip area and an improved jitter characteristic, while using a phase inversion locking algorithm to have a wide operating frequency range.

To accomplish the above object, according to one aspect of the present invention, there is provided an all-digital delay locked loop circuit based on a time-to-digital converter, the loop circuit including: a phase inversion locking control circuit for determining whether or not to use a phase inversion locking algorithm by detecting a phase difference between an input clock and an output clock and outputting the input clock or an inverted input clock; and a phase synchronization unit connected to an output terminal of the phase inversion locking control circuit to receive an output signal of the phase inversion locking control circuit and a control signal and perform phase synchronization, in which the phase synchronization unit includes a digital control delay line for receiving the input clock or the inverted input clock output from the phase inversion locking control circuit and reducing a phase error between the input clock and the output clock, and the digital control delay line includes: a coarse digital delay line for removing the phase error based on the time-to-digital converter by searching for a coarse lock point by comparing output of each unit and the input clock; and a fine digital delay line for removing the phase error through a binary search of comparing the input clock and the output clock.

According to another aspect of the present invention, there is provided a control method of an all-digital delay locked loop circuit based on a time-to-digital converter, the method including the steps of: determining whether or not to use a phase inversion locking algorithm by comparing an input clock and an output clock; and performing a phase synchronization process after determining whether or not to use the phase inversion locking algorithm, in which the step of performing a phase synchronization process includes: a coarse lock step of removing a phase error based on the time-to-digital converter by searching for a coarse lock point by comparing output of each unit and the input clock; a fine lock step of removing the phase error through a binary search of comparing the input clock and the output clock performed by a successive approximation register algorithm; and a phase tracking step of tracking a phase through a sequential search after the binary search.

DESCRIPTION OF SYMBOLS

Figure 1:
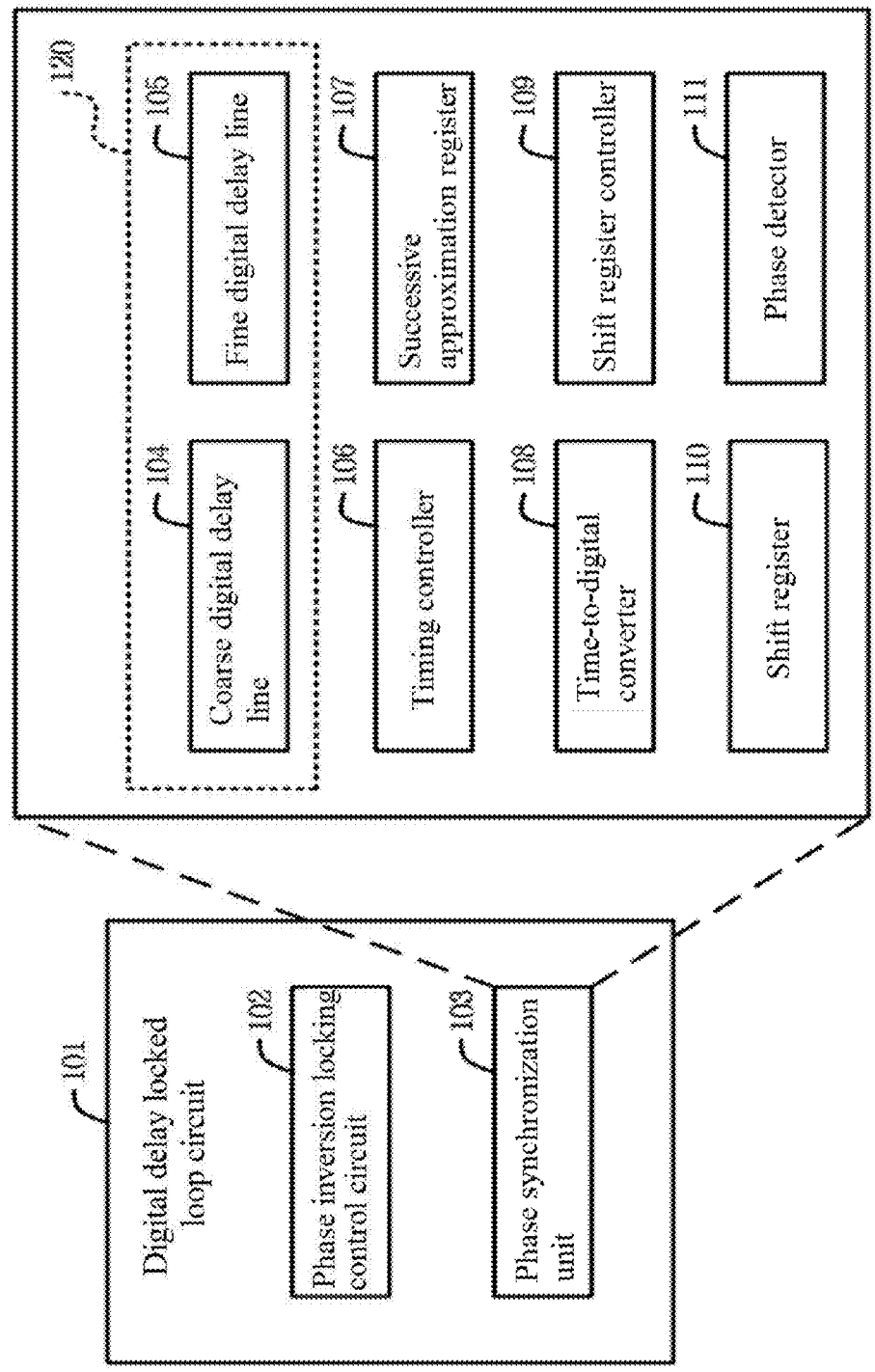
FIG. 1 is a functional block diagram showing an all-digital delay locked loop circuit based on a time-to-digital converter according to an embodiment of the present invention.

101: Digital delay locked loop circuit
102: Phase inversion locking control circuit
103: Phase synchronization unit
104: Coarse digital delay line
105: Fine digital delay line
106: Timing controller
107: Successive approximation register
108: Time-to-digital converter
109: Shift register controller
110: Shift register
111: Phase detector
120: Digital control delay line

DETAILED DESCRIPTION

The preferred embodiments of the invention will be hereafter described in detail, with reference to the accompanying drawings.

Figure 2:
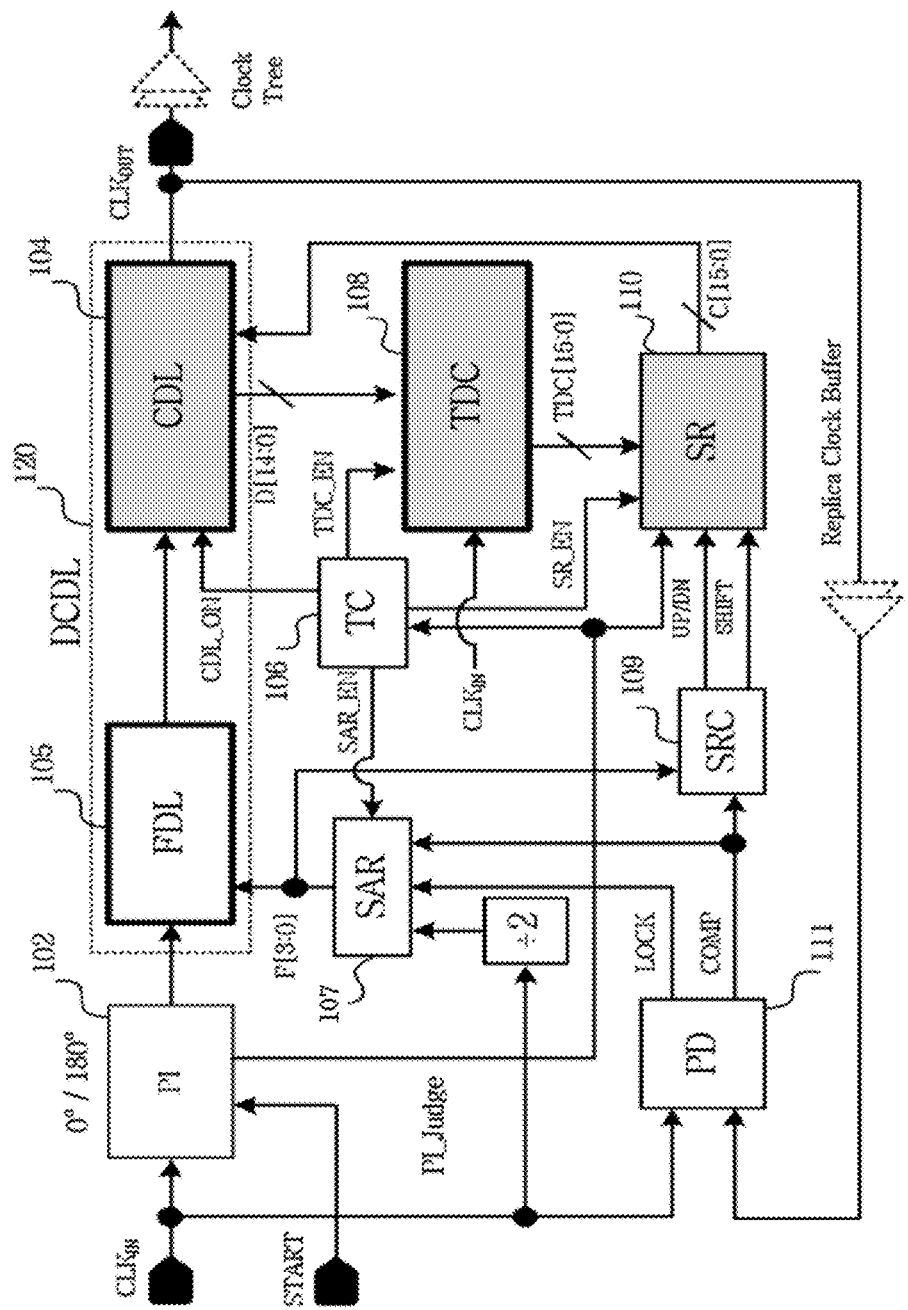
FIG. 2 is a view showing the configuration of an all-digital delay locked loop circuit based on a time-to-digital converter according to an embodiment of the present invention.

FIG. 1 is a functional block diagram showing an all-digital delay locked loop circuit based on a time-to-digital converter according to an embodiment of the present invention, and FIG. 2 is a view showing the configuration of an all-digital delay locked loop circuit based on a time-to-digital converter according to an embodiment of the present invention.

Referring to FIG. 1, an all-digital delay locked loop circuit based on a time-to-digital converter 101 according to this embodiment includes a phase inversion locking control circuit 102 and a phase synchronization unit 103.

The phase inversion locking control circuit 102 compares an input clock and an output clock and outputs the input clock or an inverted input clock.

The phase inversion locking control circuit 102 operates based on input of a start signal, determines an output clock and outputs a determination completion signal.

The phase inversion locking control circuit 102 like this initiates operation of a phase inversion locking algorithm by sensing generation of rising edges of a first input clock and an output clock and controls whether or not to use the phase inversion locking algorithm by detecting a phase difference between the input clock and the output clock and determining whether or not the phase difference between the two clocks is greater than a half cycle of the input clock. That is, the phase inversion locking control circuit 102 controls to use the phase inversion locking algorithm if the phase difference between the input clock and the output clock is greater than a half cycle of the input clock and not to use the phase inversion locking algorithm otherwise.

The phase inversion locking control circuit 102 outputs an inverted input clock when the phase inversion locking algorithm is used and outputs the input clock as is when phase inversion locking algorithm is not used.

The phase synchronization unit 103 is connected to an output terminal of the phase inversion locking control circuit 102 and performs a function of removing a phase error so that phases of the input clock and the output clock of the phase inversion locking control circuit coincide with each other.

To this end, the phase synchronization unit 103 includes a coarse digital delay line 104, a fine digital delay line 105, a timing controller 106, a successive approximation register 107, a time-to-digital converter 108, a shift register controller 109, a shift register 110 and a phase detector 111.

The phase synchronization unit 103 sequentially synchronizes the phases using a digital control delay line 120 configured of the coarse digital delay line 104 and the fine digital delay line 105. The digital control delay line 120 receives the input clock or the inverted input clock output from the phase inversion locking control circuit and reduces the phase error between the input clock and the output clock.

The coarse digital delay line 104 removes the phase error based on the time-to-digital converter 108 by searching for a coarse lock point by comparing output of each unit of the coarse digital delay line 104 with the input clock.

The fine digital delay line 105 synchronizes the phases based on the successive approximation register 107 which removes the phase error through a binary search of comparing the input clock and the output clock.

The coarse digital delay line 104 adjusts delay according to the output digital bit of the shift register 110. The coarse digital delay line 104 may minimize intrinsic delay while maintaining a bypass mode from the initial operation until search of the time-to-digital converter is completed and generate additional delay by a coarse code according to the search of the time-to-digital converter. The output of each unit can be connected to the time-to-digital converter 108 to search for a coarse lock point.

For example, the coarse digital delay line 104 includes a multiplexer for selecting and outputting a clock which outputs minimum intrinsic delay or an output having a delay accumulated according to the output digital bit of the shift register 110.

After the operation of the time-to-digital converter, the fine digital delay line 105 adjusts delay of the phase error which has not been removed from the coarse lock point according to the binary search of the successive approximation register.

The timing controller 106 is driven by receiving an output clock determination completion signal (PI_Judge) of the phase inversion locking control circuit, controls the time-to-digital converter to operate in three types of modes at every cycle of the input clock to output a delay generation signal CDL_ON, a time-to-digital converter search signal TDC_EN or a coarse code storage signal SR_EN, which are control signals corresponding to each mode, and includes a circuit for outputting a control signal SAR_EN for controlling operation of the successive approximation register to remove a further fine delay after search of the time-to-digital converter.

The successive approximation register 107 is driven by receiving a time-to-digital converter operation completion signal SAR_EN, searches for an output digital bit through a binary search and performs continuous phase tracking through a sequential search method after finishing the binary search.

The successive approximation register 107 outputs a digital bit for adjusting delay of the fine digital delay line 105, and the output digital bit can be input into the shift register controller 109 for up/down and shift of the shift register.

For example, the successive approximation register 107 drives the binary search by operating delay of the output digital bit and determining whether or not to drive delay of a corresponding bit by using the input clock and the output clock according to the delay of the output digital bit as a comparison signal COMP.

The time-to-digital converter 108 operates by receiving a time-to-digital converter search signal TDC_EN among the output signals of the timing controller 106 and searches for a coarse lock point through comparison of the output clock and the input clock of all units of the coarse digital delay line.

The shift register controller 109 receives the output digital bit of the successive approximation register 107 and outputs an up/down signal (UP/DN) and a shift signal SHIFT connected to the shift register to operate a fine code and a coarse code detected by the sequential search as one counter code.

The shift register 110 is a circuit for storing a digital bit which determines delay of the coarse digital delay line, and it stores a result of time-to-digital search in accordance with the storage signal SR_EN and performs an up/down and shift operation according to the control signal of the shift register controller while the phase tracking is performed by the sequential search.

The phase detector 111 outputs a comparison signal COMP and a search completion signal LOCK through comparison of the input clock and the output clock.

That is, the phase synchronization unit 103 determines delay of the digital delay line according to output digital bits of the shift register and the successive approximation register to remove the phase error through the inclusion of the step of the time-to-digital converter and the binary search step of the successive approximation register so that the phases of the input clock and the output clock coincide with each other, and the phase synchronization unit 103 continuously tracks the phases through a sequential search after the binary search.

The all-digital delay locked loop circuit based on a time-to-digital converter according to FIGS. 1 and 2 can implement a short locking time, low power consumption, a small chip area and an improved jitter performance, while operating at a very high maximum operating frequency, by combining a phase inversion algorithm with a hybrid type search algorithm including phase tracking performed by a time-to-digital converter search, a binary search and a sequential search.

Figure 3:
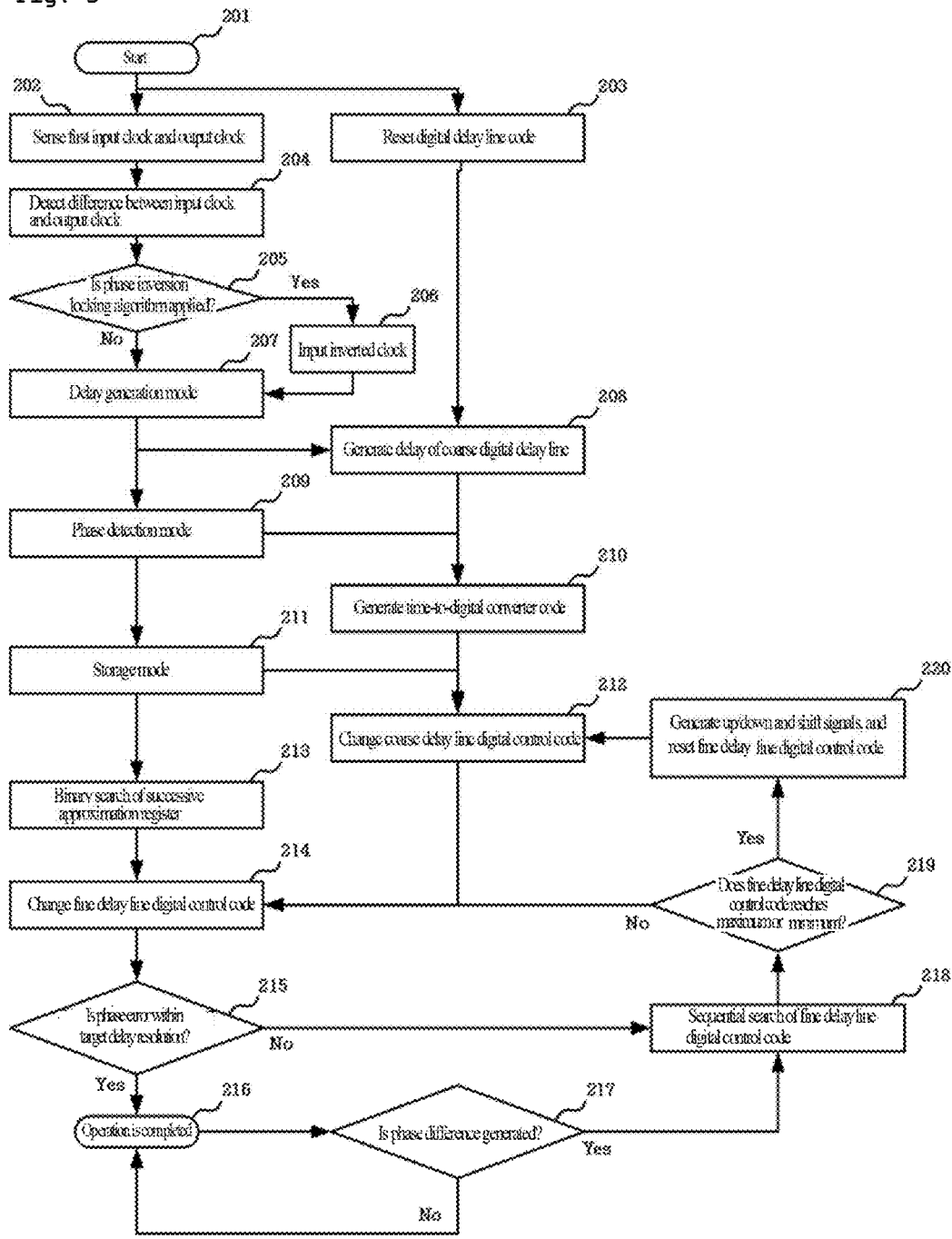
FIG. 3 is a flowchart illustrating a control process of an all-digital delay locked loop circuit based on a time-to-digital converter according to an embodiment of the present invention.

FIG. 3 is a flowchart illustrating a control process of an all-digital delay locked loop circuit based on a time-to-digital converter according to an embodiment of the present invention.

Referring to FIG. 3, a process of operating the time-to-digital converter in three types of modes is shown, and the three types of modes is divided into a delay generation mode, a phase detection mode and a storage mode.

The delay generation mode is a mode for generating delay of all units of the coarse digital delay line to search for a coarse lock point.

The phase detection mode is a mode for performing a time-to-digital converter search, and a storage mode is a mode for storing a detected coarse code in the shift register.

Describing each operating process in more detail, first, a process of sensing a first input clock and an output clock is performed (step 202).

The phase inversion locking control circuit performs a process of detecting a phase difference between the input clock and the output clock (step 204).

After detecting the phase difference between the clocks, a process of determining whether or not to apply a phase inversion locking algorithm is performed (step 205).

In the case of this embodiment, whether or not to use the phase inversion locking algorithm is determined by determining whether or not the phase difference between the clocks is greater than a half cycle of the input clock, and an inverted input clock is output when the phase inversion locking algorithm is used (step 206), and the input clock is output as is when phase inversion locking algorithm is not used.

The timing controller controls the time-to-digital converter to operate in three types of modes at every cycle of the input clock.

The delay generation mode (step 207) generates delay of all units of the coarse digital delay line to search for a coarse lock point (step 208).

The phase detection mode (step 209) is a mode for performing a time-to-digital converter search and generates a time-to-digital converter code (step 210).

Then, the storage mode (step 211) stores a detected coarse code in the shift register.

The successive approximation register is operated to remove a further fine delay after the time-to-digital converter search and performs a binary search (step 213).

It is determined whether or not a phase error is within a target delay resolution (step 215), and the operation is terminated if the phase error is within the target delay resolution as a result of the determination (step 216).

If the phase error is not within the target delay resolution (step 219), continuous phase tracking is performed through sequential search of a fine delay line digital control code (step 218).

If the fine delay line digital control code is not maximum or minimum, a process of changing the fine delay line digital control code is performed (step 214).

On the other hand, if the fine delay line digital control code reaches its maximum or minimum value (step 219), the fine delay line digital control code is reset (step 220). Then, a process of changing a coarse delay line digital control code is performed (step 212).

Figure 4:
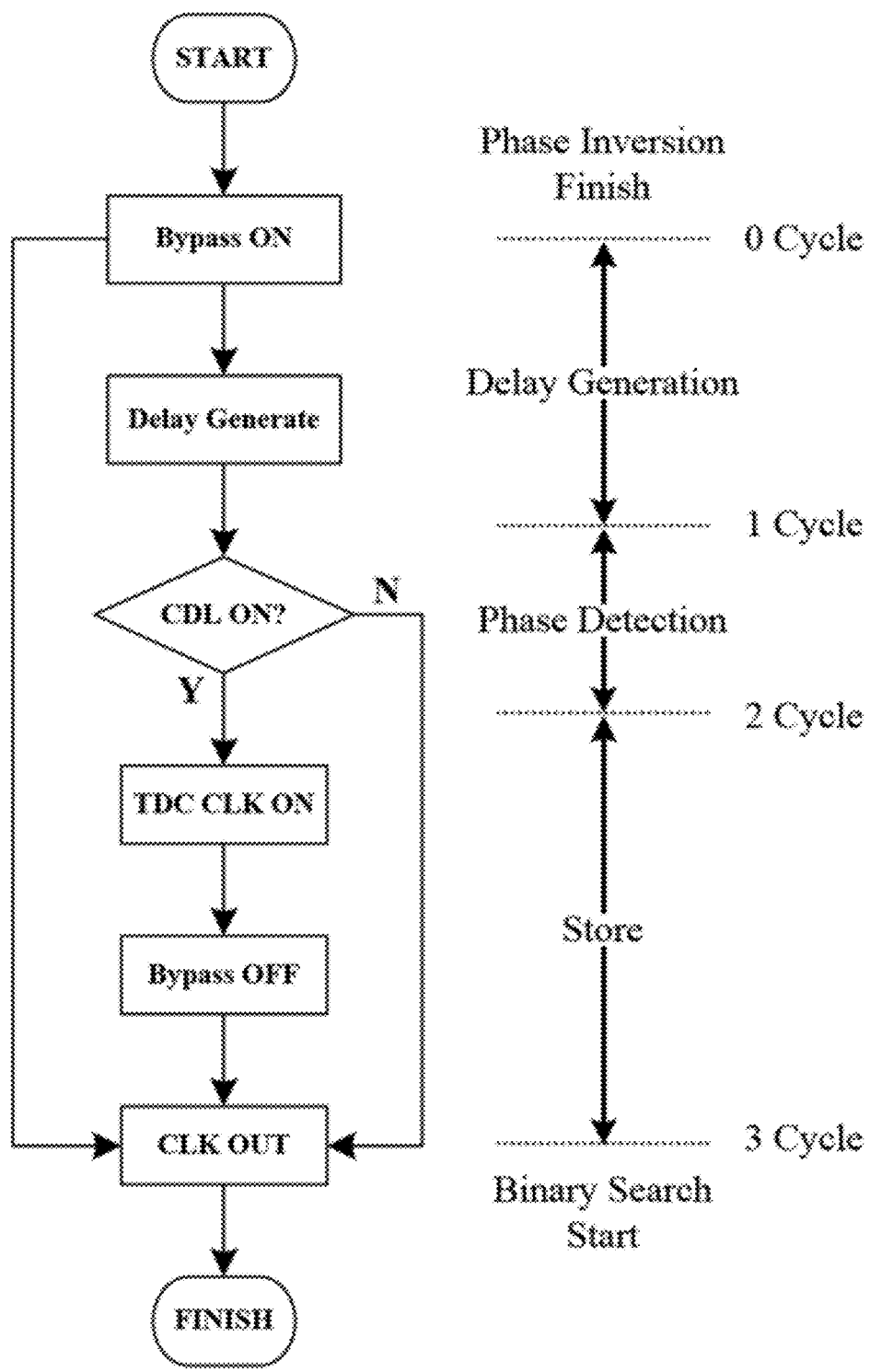
FIG. 4 is a flowchart illustrating an output clock determination operation of a coarse digital delay line based on the search of a time-to-digital converter according to an embodiment of the present invention.
Figure 5:
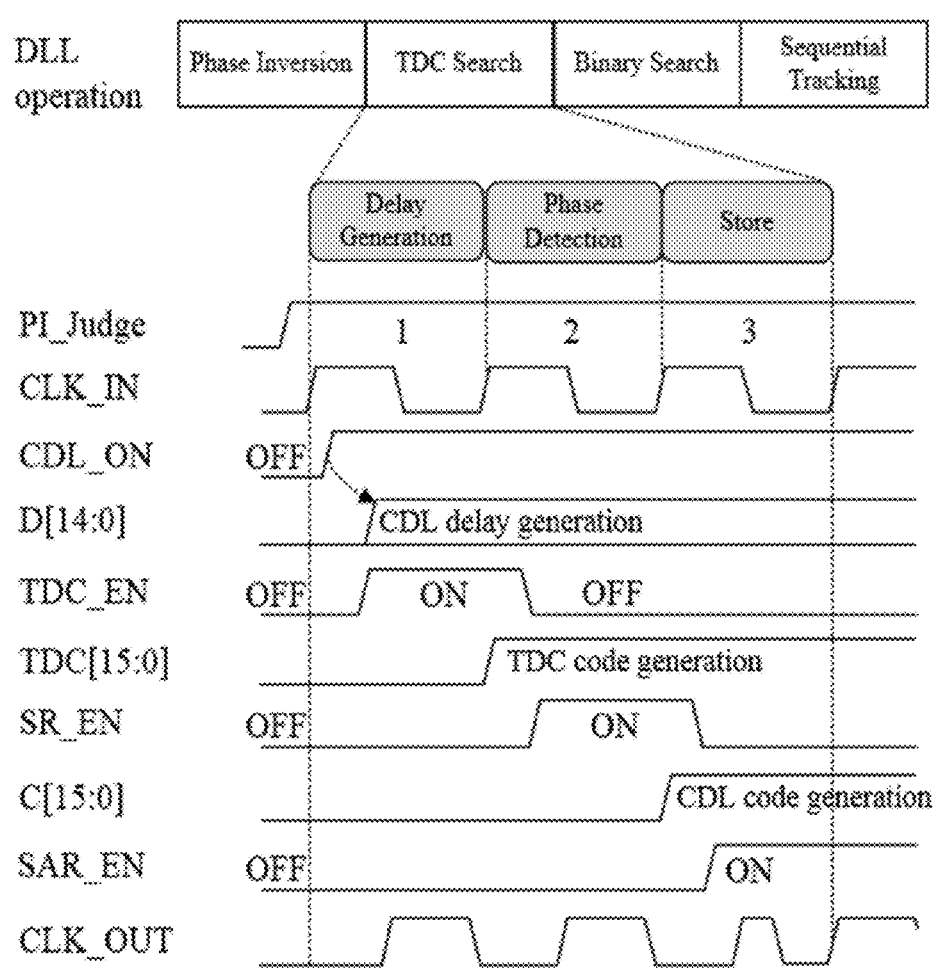
FIG. 5 is a diagram showing the flow of a control signal for searching for a coarse lock point and storing the coarse lock point in a register, through a time-to-digital converter search according to three types of modes.

FIG. 4 is a flowchart illustrating an output clock determination operation of a coarse digital delay line based on the search of a time-to-digital converter according to an embodiment of the present invention, and FIG. 5 is a diagram showing the flow of a control signal for searching for a coarse lock point and storing the coarse lock point in a register, through a time-to-digital converter search according to three types of modes.

FIG. 4 is a view illustrating bypass operation of the coarse digital delay line for implementing a very high maximum operating frequency and determination of delay of a clock according to operation of the time-to-digital converter.

Referring to FIG. 5, output signals of the time-to-digital converter timing control circuit progress a search in steps, and a delay search can be progressed by combining the phase inversion algorithm and the time-to-digital converter, and a lock point of the time-to-digital converter can be stored in the shift register as a result of the search.

A digital delay locked loop circuit (DLL) operates for phase tracking through a phase inversion algorithm, a time-to-digital converter search (TDC search), a binary search and a sequential search.

The timing controller is driven by receiving an output clock determination completion signal (PI_Judge) of the phase inversion locking control circuit. The timing controller controls the time-to-digital converter to operate in three types of modes at every cycle of the input clock.

If the timing controller outputs a delay generation signal CDL_ON, the coarse digital delay line generates a delay.

If the timing controller outputs a time-to-digital converter search signal TDC_EN, the time-to-digital converter generates a time-to-digital converter code according thereto.

Then, if the timing controller outputs a shift register control signal SR_EN, the shift register generates a coarse delay line digital control code.

If the timing controller outputs a control signal SAR_EN for controlling operation of the successive approximation register, the successive approximation register performs a binary search.

Figure 6:
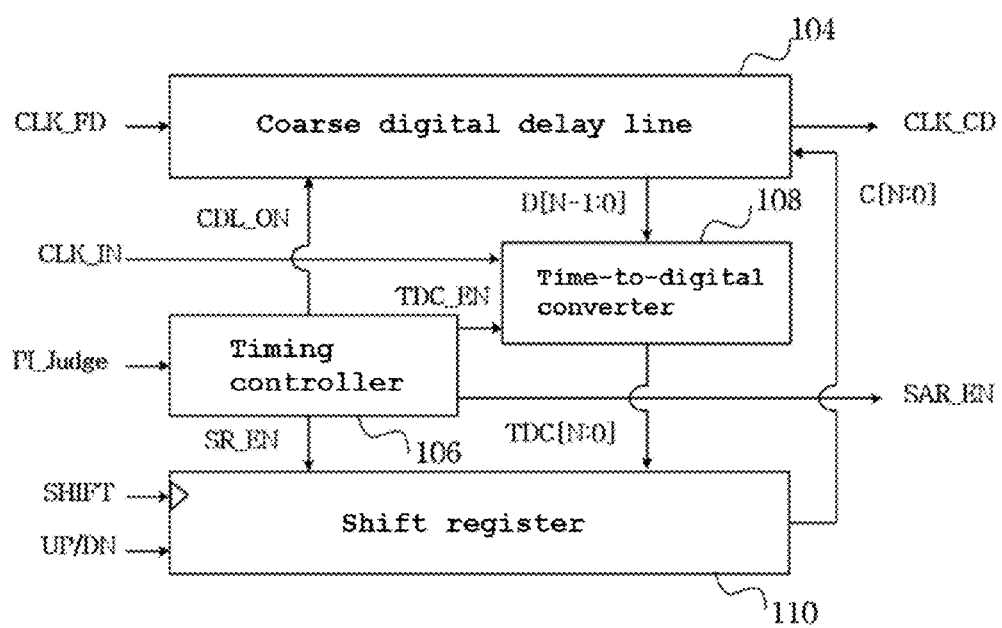
FIG. 6 is a view showing a configuration for a time-to-digital converter search.

FIG. 6 is a view showing a configuration for a time-to-digital converter search.

Referring to FIG. 6, the time-to-digital converter operating after an algorithm selection determination signal for the phase inversion locking algorithm is generated can be controlled by the timing controller to perform a search in steps, and a digital bit stored as a result of the search may adjust delay of the coarse digital delay line and can be controlled by up/down and shift signals.

Figure 7:
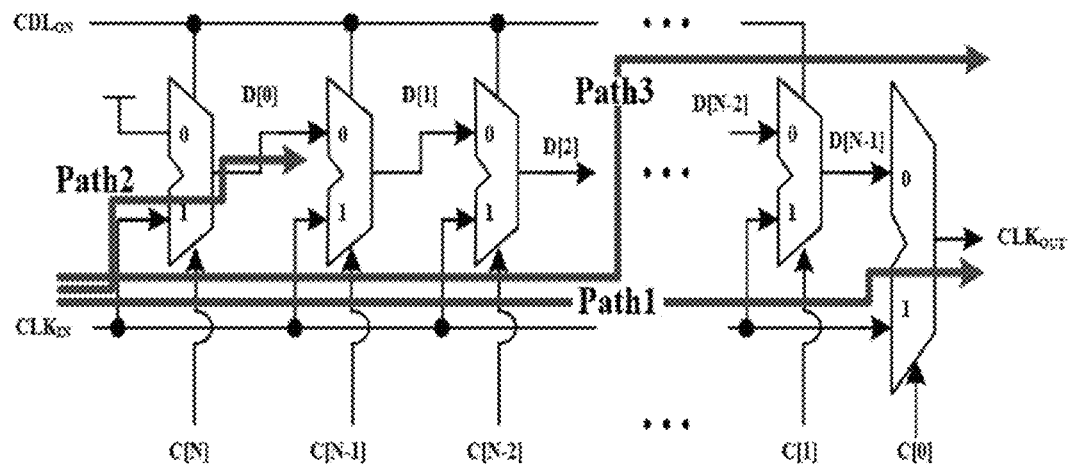
FIG. 7 is a view showing the configuration of the internal circuit of a coarse digital delay line.

FIG. 7 is a view showing the configuration of the internal circuit of a coarse digital delay line.

Referring to FIG. 7, the coarse digital delay line may include a multiplexer to have a minimum intrinsic delay, and the multiplexer may select and output a clock having a delay accumulated by a coarse delay unit (Path 2 or Path 3) or a bypass clock (Path 1).

Figure 8:
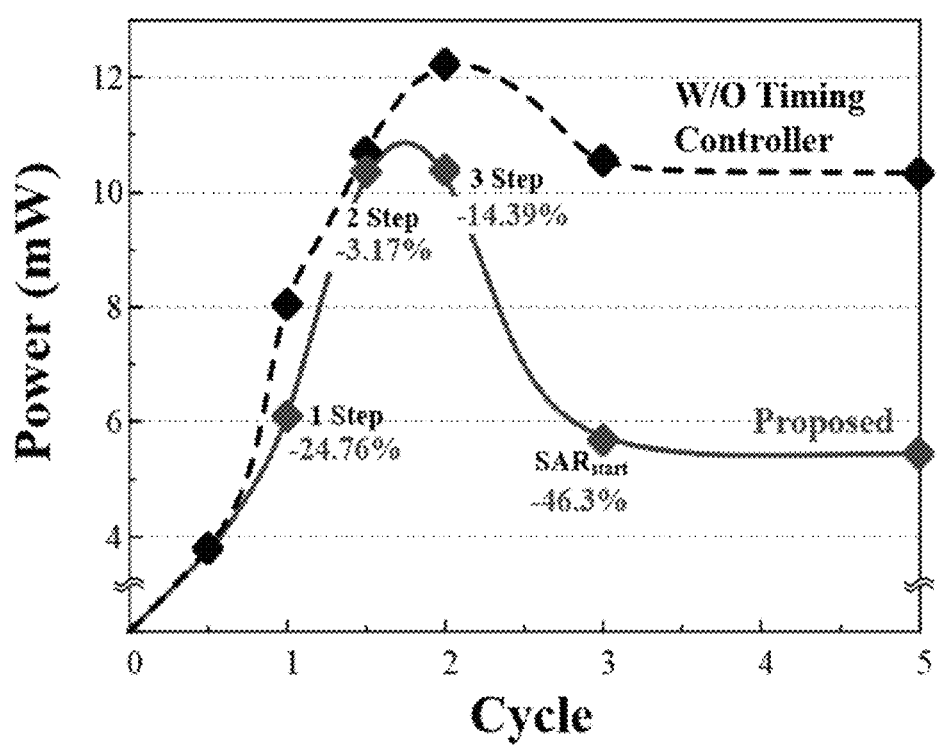
FIG. 8 is a graph showing change of power consumption according to a timing controller.

FIG. 8 is a graph showing change of power consumption according to a timing controller.

Referring to FIG. 8, it can be understood that power consumption can be reduced when the timing controller sequentially controls the time-to-digital converter.

Figure 9:
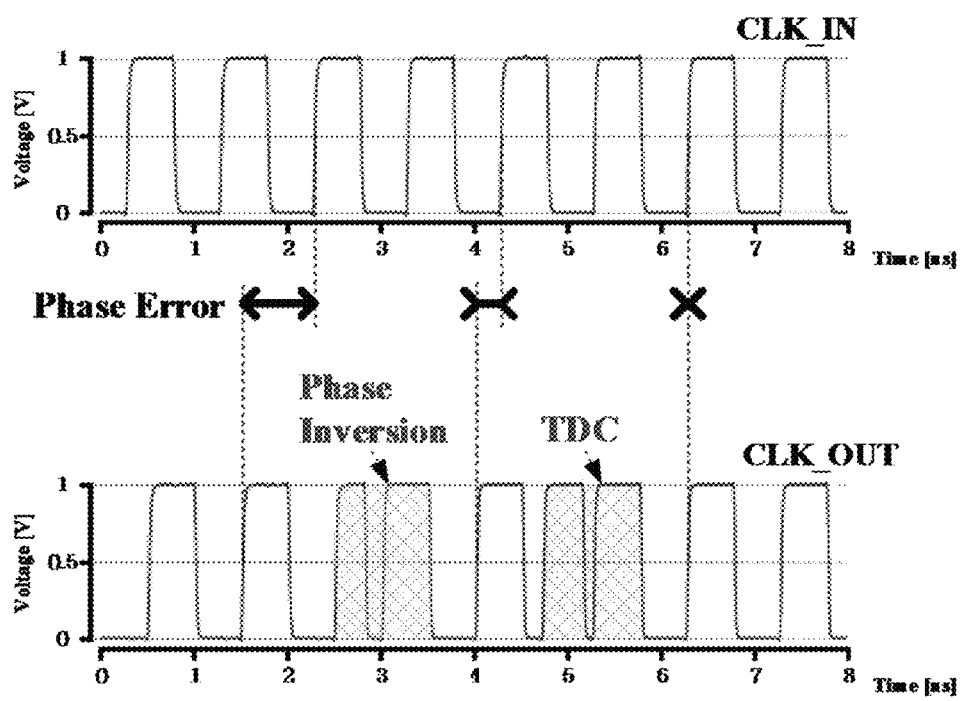
FIG. 9 is a graph showing output of a digital delay locked circuit.
Figure 10:
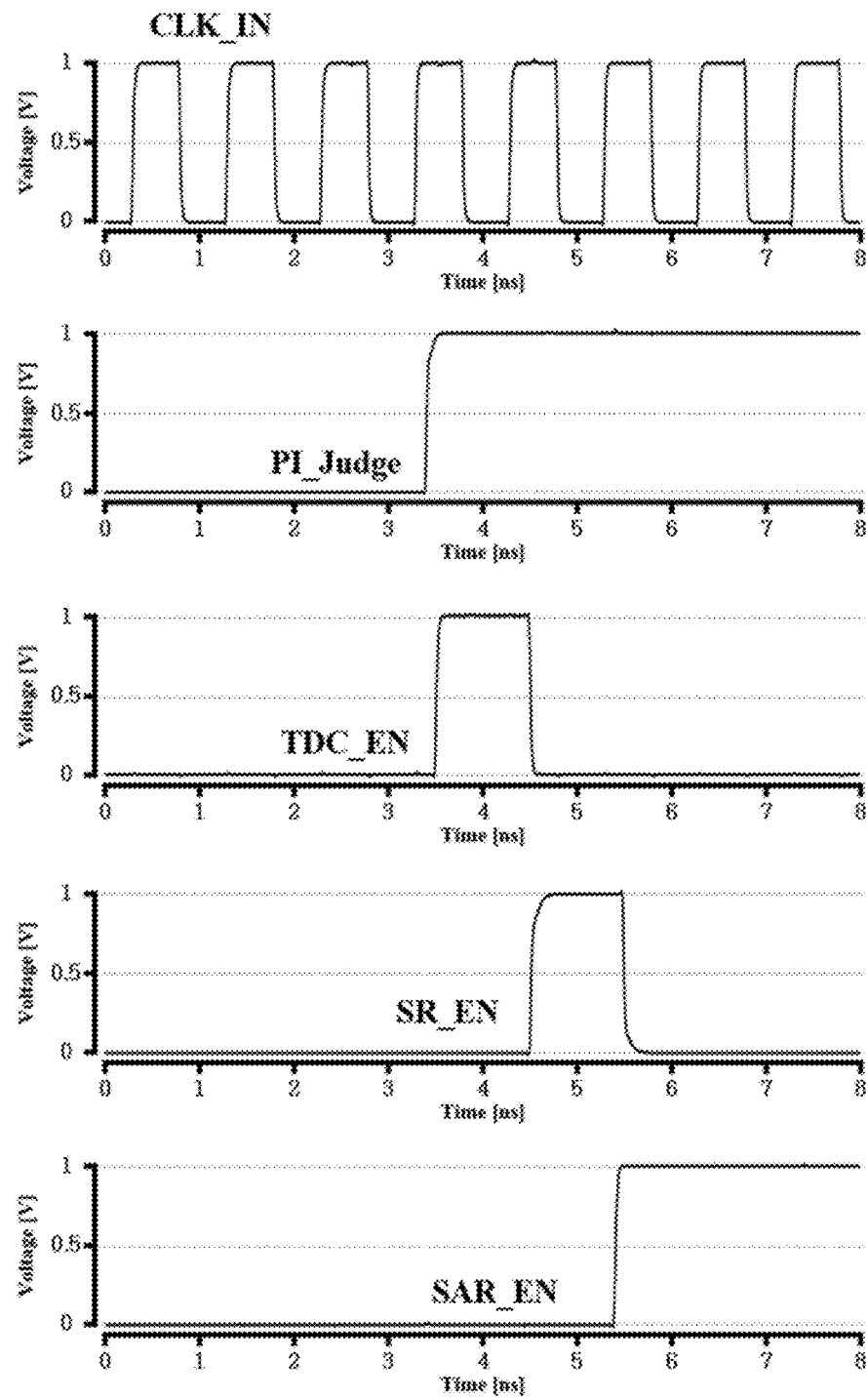
FIG. 10 is a graph showing an output signal of a time-to-digital converter timing controller.

FIG. 9 is a graph showing output of a digital delay locked circuit, and FIG. 10 is a graph showing an output signal of a time-to-digital converter timing controller.

Referring to FIG. 9, a phase error can be removed very rapidly within a few cycles through phase inversion and search of the time-to-digital converter, and referring to FIG. 10, it can be understood that a control signal of each mode can be output after being synchronized with the input clock, for the search of the time-to-digital converter.

Figure 11:
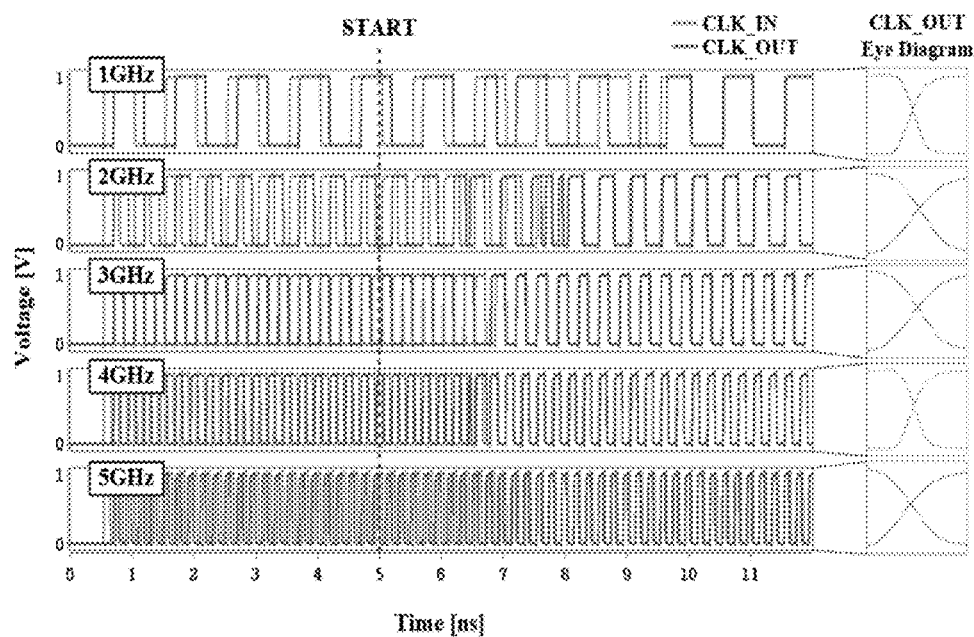
FIG. 11 is a graph simulating a locking algorithm according to change of frequency and a graph showing eye diagrams of output clocks.

FIG. 11 is a graph simulating a locking algorithm according to change of frequency and a graph showing eye diagrams of output clocks.

If a phase synchronization process is performed by applying the time-to-digital converter to the phase inversion algorithm as described in the present invention, a digital delay locked loop circuit having a very short locking time, low power consumption, a small chip area and an improved jitter characteristic can be implemented.

In addition, the present invention is advantageous in that since the characteristic of the time-to-digital converter reduces intrinsic delay of a delay line, the maximum operating frequency can be increased very high.

Furthermore, the amount of delay can be controlled to change like a counter by connecting both the coarse digital delay code and the fine digital delay code when a sequential search is performed, by using a shift register capable of up and down.

While an all-digital delay locked loop circuit based on a time-to-digital converter and a control method thereof according to the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An all-digital delay locked loop circuit based on a time-to-digital converter, the loop circuit comprising:
a phase inversion locking control circuit for determining whether or not to use a phase inversion locking algorithm by detecting a phase difference between an input clock and an output clock and outputting the input clock or an inverted input clock; and
a phase synchronization unit connected to an output terminal of the phase inversion locking control circuit to receive an output signal of the phase inversion locking control circuit and a control signal and perform phase synchronization, wherein
the phase synchronization unit includes a digital control delay line for receiving the input clock or the inverted input clock output from the phase inversion locking control circuit and reducing a phase error between the input clock and the output clock, wherein
the digital control delay line includes:
a coarse digital delay line for removing the phase error based on the time-to-digital converter by searching for a coarse lock point by comparing output of each unit and the input clock; and
a fine digital delay line for removing the phase error through a binary search of comparing the input clock and the output clock.

2. The loop circuit according to claim 1, wherein the phase synchronization unit further includes a timing controller for controlling the time-to-digital converter to operate in three types of modes at every cycle of the input clock.

3. The loop circuit according to claim 2, wherein the timing controller is driven by receiving an output clock determination completion signal (PI_Judge) of the phase inversion locking control circuit.

4. The loop circuit according to claim 2, wherein the three types of modes of the time-to-digital converter include a delay generation mode, a phase detection mode and a storage mode, wherein the delay generation mode generates delay of all units of the coarse digital delay line to search for the coarse lock point, the phase detection mode performs a time-to-digital converter search, and the storage mode stores a detected coarse code in a shift register.

5. The loop circuit according to claim 4, wherein the timing controller outputs a delay generation signal CDL_ON which is a control signal of the delay generation mode, a time-to-digital converter search signal TDC_EN which is a control signal of the phase detection mode and a coarse code storage signal SR_EN which is a control signal of the storage mode, and includes a circuit for outputting a control signal SAR_EN for controlling operation of a successive approximation register to remove a further fine delay after the time-to-digital converter search.

6. The loop circuit according to claim 2, wherein the time-to-digital converter receives an output signal of the timing controller and searches for the coarse lock point by comparing an output clock and an input clock of the coarse digital delay line.

7. The loop circuit according to claim 2, wherein the phase synchronization unit further includes a successive approximation register driven by receiving a time-to-digital converter operation completion signal SAR_EN to search for an output digital bit through a binary search and perform phase tracking through a sequential search after finishing the binary search.

8. The loop circuit according to claim 7, wherein the successive approximation register outputs a digital bit for adjusting delay of the fine digital delay line, and the output digital bit is input into a shift register controller for up/down and shift of a shift register.

9. The loop circuit according to claim 7, wherein the phase synchronization unit further includes:
   a shift register for storing a digital bit which determines delay of the coarse digital delay line; and
   a shift register controller for receiving the output digital bit of the successive approximation register and outputting an up/down signal (UP/DN) and a shift signal SHIFT connected to the shift register to operate a fine code and a coarse code detected by the sequential search as one counter code.

10. The loop circuit according to claim 9, wherein the shift register stores a result of time-to-digital search in accordance with a storage signal SR_EN and performs an up/down and shift operation according to a control signal of the shift register controller while the phase tracking is performed by the sequential search.

11. The loop circuit according to claim 2, wherein the phase synchronization unit further includes a phase detector for outputting a comparison signal COMP and a search completion signal LOCK through comparison of the input clock and the output clock.

12. The loop circuit according to claim 2, wherein the coarse digital delay line includes a multiplexer for selecting and outputting a clock having a delay accumulated by a coarse delay unit or a bypass clock.

13. The loop circuit according to claim 2, wherein the phase synchronization unit receives a determination completion signal of determining whether or not to use the phase inversion locking algorithm and progresses phase synchronization in order of a time-to-digital converter search, a binary search and a sequential search.

14. A control method of an all-digital delay locked loop circuit based on a time-to-digital converter according to claim 1, the method comprising the steps of:
   determining whether or not to use a phase inversion locking algorithm by comparing an input clock and an output clock; and
   performing a phase synchronization process after determining whether or not to use the phase inversion locking algorithm, wherein
   the step of performing a phase synchronization process includes:
   a coarse lock step of removing a phase error based on the time-to-digital converter by searching for a coarse lock point by comparing output of each unit and the input clock;
   a fine lock step of removing the phase error through a binary search of comparing the input clock and the output clock performed by a successive approximation register algorithm; and
   a phase tracking step of tracking a phase through a sequential search after the binary search.

15. The method according to claim 14, wherein the coarse lock step operates in
   a delay generation mode of receiving an operation completion signal output from a phase inversion locking control circuit and generating all delays of a coarse digital delay line;
   a phase detection mode of performing a time-to-digital converter search; and
   a storage mode of storing a detected coarse code in a shift register.

16. The method according to claim 15, further comprising the steps of:
   determining, after performing the phase synchronization step, whether or not a phase error between the input clock and the output clock is removed within a target delay resolution; and
   terminating the operation when the phase error between the input clock and the output clock is removed within the target delay resolution as a result of the determination, and determining whether a fine delay line digital control code can be increased or decreased when the phase error is not removed within the target delay resolution.

17. The method according to claim 16, wherein if the fine delay line digital control code can be increased or decreased as a result of the determination, a sequential search is progressed on an output digital bit, and if the fine delay line digital control code exceeds a most or least significant bit, the method further comprises:
   a determination steps of determining to operate a fine code and a coarse code as a connected counter code through a shift operation of a coarse delay line digital control code performed by a shift register controller; and
   a phase tracking step of allowing continuous phase tracking through a sequential search of the fine code and the coarse code based on a result of the determination.

* * * * *